United States Patent
Hino et al.

(10) Patent No.: US 7,943,933 B2
(45) Date of Patent: May 17, 2011

(54) THIN FILM TRANSISTOR SUBSTRATE AND DISPLAY DEVICE WITH OXYGEN-CONTAINING LAYER

(75) Inventors: Aya Hino, Kobe (JP); Hiroshi Gotou, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

(21) Appl. No.: 12/126,527

(22) Filed: May 23, 2008

(65) Prior Publication Data

US 2008/0315203 A1  Dec. 25, 2008

(30) Foreign Application Priority Data

Jun. 20, 2007  (JP) .................................. 2007-163093

(51) Int. Cl.
*H01L 29/04* (2006.01)
(52) U.S. Cl. ............ 257/59; 257/72; 257/347; 257/348; 257/349; 257/350; 257/351; 257/352; 257/353; 257/354; 257/E33.001; 349/42; 349/43; 349/147
(58) Field of Classification Search ............ 257/59, 257/359, 33.001, 72, 347, 348, 349, 350, 257/351, 352, 353, 354, E33.001; 349/42, 349/43, 147
See application file for complete search history.

(56) References Cited

U.S. PATENT DOCUMENTS

| | | | |
|---|---|---|---|
| 5,514,909 A | 5/1996 | Yamamoto et al. | |
| 6,033,542 A | 3/2000 | Yamamoto et al. | |
| 6,075,257 A * | 6/2000 | Song ................... | 257/59 |
| 6,096,438 A | 8/2000 | Takagi et al. | |
| 6,218,206 B1 | 4/2001 | Inoue et al. | |
| 6,252,247 B1 | 6/2001 | Sakata et al. | |
| 6,791,188 B2 | 9/2004 | Hagihara et al. | |
| 6,866,949 B2 * | 3/2005 | Ota et al. ......... | 428/702 |
| 7,098,539 B2 | 8/2006 | Gotoh et al. | |
| 7,154,180 B2 | 12/2006 | Gotoh et al. | |
| 7,262,085 B2 | 8/2007 | Gotoh et al. | |
| 7,365,810 B2 | 4/2008 | Gotoh et al. | |
| 2005/0218519 A1 * | 10/2005 | Koike et al. ......... | 257/756 |

(Continued)

FOREIGN PATENT DOCUMENTS

JP  63-308384  12/1988

(Continued)

OTHER PUBLICATIONS

U.S. Appl. No. 11/931,336, filed Oct. 31, 2007, Takagi, et al.

(Continued)

*Primary Examiner* — N Drew Richards
*Assistant Examiner* — John P. Dulka
(74) *Attorney, Agent, or Firm* — Oblon, Spivak, McClelland, Maier & Neustadt, L.L.P.

(57) ABSTRACT

Disclosed herein is a TFT substrate which exhibits good characteristic properties despite the omission of the barrier metal layer to be normally interposed between the source-drain electrodes and the semiconductor layer in the TFT. The TFT substrate permits sure and direct connection with the semiconductor layer of the TFT. The thin film transistor substrate has a substrate, a semiconductor layer and source-drain electrodes. The source-drain electrodes are composed of oxygen-containing layers and thin films of pure copper or a copper alloy. The oxygen-containing layer contains oxygen such that part or all of oxygen combines with silicon in the semiconductor layer. And, the thin films of pure copper or a copper alloy connect with the semiconductor layer of the thin film transistor through the oxygen-containing layers.

8 Claims, 7 Drawing Sheets

U.S. PATENT DOCUMENTS

| | | | |
|---|---|---|---|
| 2006/0091792 A1 | 5/2006 | Kugimiya et al. | |
| 2006/0180250 A1 | 8/2006 | Kugimiya et al. | |
| 2006/0181198 A1 | 8/2006 | Gotoh et al. | |
| 2006/0237849 A1 | 10/2006 | Gotoh et al. | |
| 2006/0275618 A1 | 12/2006 | Kugimiya et al. | |
| 2006/0278872 A1* | 12/2006 | Fang et al. | 257/59 |
| 2007/0040172 A1 | 2/2007 | Kawakami et al. | |
| 2007/0040173 A1 | 2/2007 | Kugimiya et al. | |
| 2007/0173055 A1* | 7/2007 | Ohtsuka et al. | 438/627 |
| 2007/0278497 A1 | 12/2007 | Kawakami et al. | |
| 2008/0081532 A1 | 4/2008 | Okuno | |
| 2008/0121522 A1 | 5/2008 | Ehira et al. | |
| 2008/0278649 A1* | 11/2008 | Koike et al. | 349/42 |

FOREIGN PATENT DOCUMENTS

| | | |
|---|---|---|
| JP | 7-66423 | 3/1995 |
| JP | 11-283934 | 10/1999 |
| JP | 11-284195 | 10/1999 |
| JP | 11-337976 | 12/1999 |
| JP | 2001-196371 | 7/2001 |
| JP | 2002-353222 | 12/2002 |
| JP | 2003-273109 | 9/2003 |
| JP | 2004-133422 | 4/2004 |
| JP | 2004-212940 | 7/2004 |
| JP | 2004-214606 | 7/2004 |
| JP | 2005-166757 | 6/2005 |
| JP | 2006-80495 | 3/2006 |
| KR | 1999-0052931 | 7/1999 |
| KR | 10-2007-0031090 | 3/2007 |
| WO | WO 2007/004096 A2 | 1/2007 |

OTHER PUBLICATIONS

U.S. Appl. No. 12/131,444, filed Jun. 2, 2008, Gotou.
U.S. Appl. No. 12/131,493, Jun. 2, 2008, Gotou, et al.
U.S. Appl. No. 12/136,409, filed Jun. 10, 2008, Ochi, et al.
U.S. Appl. No. 12/376,863, filed Feb. 9, 2009, Hino, et al.
U.S. Appl. No. 12/355,274, filed Jan. 16, 2009, Kugimiya, et al.
U.S. Appl. No. 12/415,379, filed Mar. 31, 2009, Takagi, et al.
U.S. Appl. No. 12/414,877, filed Mar. 31, 2009, Takagi, et al.
U.S. Appl. No. 12/312,907, filed Jun. 1, 2009, Gotou, et al.
U.S. Appl. No. 12/517,362, filed Jun. 3, 2009, Hino, et al.
U.S. Appl. No. 12/528,008, filed Aug. 20, 2009, Gotou, et al.
U.S. Appl. No. 12/172,442, filed Jul. 14, 2008, Takagi, et al.
U.S. Appl. No. 12/681,542, filed Apr. 2, 2010, Ochi, et al.
U.S. Appl. No. 12/812,913, filed Jul. 14, 2010, Ochi, et al.
U.S. Appl. No. 12/918,727, filed Aug. 20, 2010, Miki, et al.
U.S. Appl. No. 12/922,764, filed Sep. 15, 2010, Goto, et al.
U.S. Appl. No. 12/922,965, filed Sep. 16, 2010, Nakai, et al.
U.S. Appl. No. 12/936,572, filed Oct. 6, 2010, Kawakami, et al.

* cited by examiner

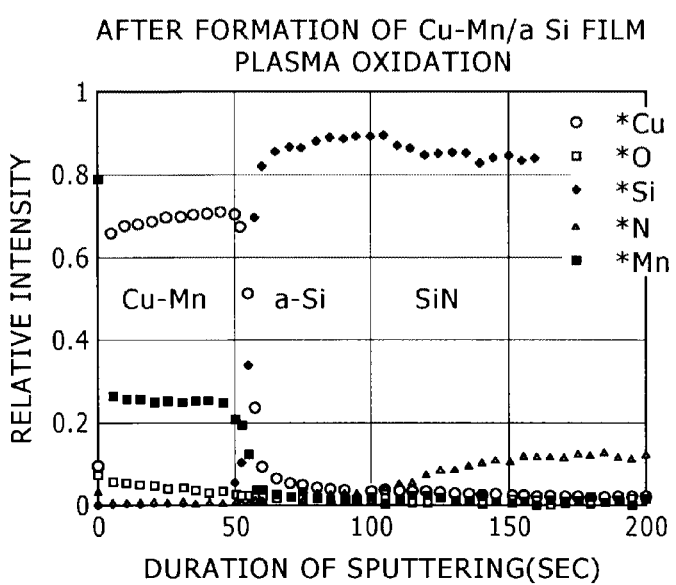
FIG.6A AFTER FORMATION OF Cu-Mn/a Si FILM PLASMA OXIDATION
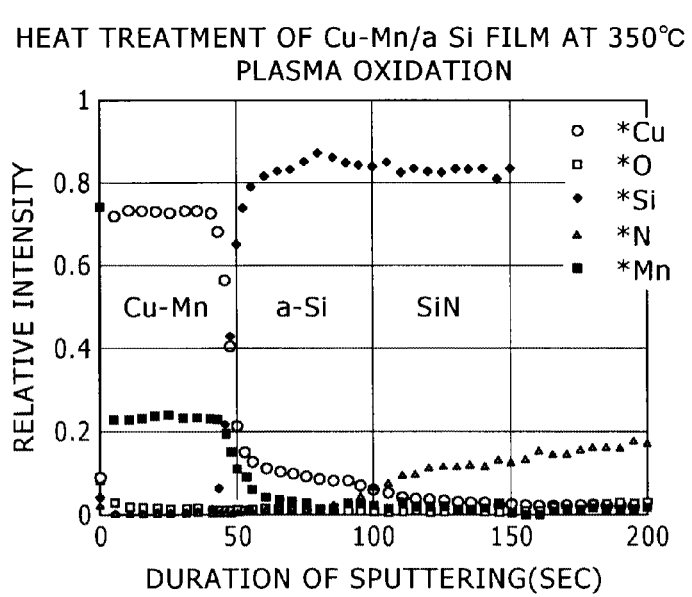
FIG.6B HEAT TREATMENT OF Cu-Mn/a Si FILM AT 350°C PLASMA OXIDATION

THIN FILM TRANSISTOR SUBSTRATE AND DISPLAY DEVICE WITH OXYGEN-CONTAINING LAYER

BACKGROUND OF THE INVENTION

1. Field of the Invention

The present invention relates to a thin film transistor substrate which will be used for liquid crystal displays, semiconductor devices, and optical parts, and relates also to a display device. More particularly, the present invention relates to a new thin film transistor substrate in which the source-drain electrodes can be connected directly to the semiconductor layer of the thin film transistor.

Liquid crystal display units find use in various applications ranging from small portable telephones to large televisions exceeding 30 inches. They fall under two classes—simple matrix type and active matrix type—according to the pixel driving method. The latter employs thin film transistors (TFT) as switching elements and is in general use because of its ability to produce high-quality images and high-speed animations.

FIG. 1 is a schematic diagram illustrating the structure and the principle of operation of a typical TFT substrate used for the liquid crystal display unit of active matrix type. The shown TFT has hydrogenated amorphous silicon as its active semiconductor layer.

The liquid crystal display 100 shown in FIG. 1 is composed of a TFT substrate 1, a facing substrate 2 (which faces said TFT substrate), and a liquid crystal layer 3, which is interposed between the TFT substrate 1 and the facing substrate 2 and which also functions as an optical modulating layer. The TFT substrate 1 is composed of an insulating glass substrate 1a, a TFT 4, a transparent pixel electrode 5, and wirings 6 (including scanning line and signal line). The transparent pixel electrode 5 is a film of indium tin oxide (ITO) composed of indium oxide ($In_2O_5$) and tin oxide (SnO), about 10 mass %. The TFT substrate 1 is driven by the driver circuit 13 and the control circuit 14 connected therewith through the TAB tape 12.

The facing substrate 2 has the common electrode 7 (which is formed entirely on that side of the insulating glass substrate 1b which is opposite to the TFT substrate 1), the color filter 8 (which is arranged at the position opposite to the transparent pixel electrode 5), and the light shielding film 9 (which is arranged at the position opposite to the TFT 4 and the wiring 6 on the TFT substrate 1). The facing substrate 2 also has the alignment layer 11 to orient liquid crystal molecules (not shown) contained in the liquid crystal layer 3.

The TFT substrate 1 and the facing substrate 2 have the polarizers 10a and 10b, respectively, on their outer sides (opposite to the liquid crystal layer 3).

The liquid crystal panel 100 works in such a way that the facing substrate 2 and the transparent pixel electrode 5 generate an electric field between them which controls the direction of orientation of the liquid crystal molecules in the liquid crystal layer 3. Thus the light passing through the liquid crystal layer 3 undergoes modulation. This results in a controlled passage of light through the facing substrate 2, thereby generating images.

FIG. 2 is a schematic diagram showing the important part (A) in FIG. 1. It illustrates the structure and the principle of operation of the conventional amorphous silicon TFT substrate used for the liquid crystal panel.

The TFT shown in FIG. 2 is constructed as follows. On the glass substrate (not shown) is formed the scanning line (gate wiring) 25, part of which functions as the gate electrode 26 to turn on and off the TFT. The gate electrode 26 is covered with the gate insulating film (silicon nitride film) 27. The scanning line 25 intersects the signal line (source-drain wiring) 34, with the gate insulating film 27 interposed between them. Part of the signal line 34 functions as the source electrode 28 of the TFT. On the gate insulating film 27 are formed the amorphous silicon channel layer (active semiconductor layer) 33, the signal line (source-drain wiring) 34, and the interlayer insulating silicon nitride film (protective film) 30. The TFT of this type is usually referred to as that of bottom-gate type.

The amorphous silicon channel layer 33 is composed of a phosphorus-doped layer (n-layer) and an undoped intrinsic layer (i-layer). In the pixel region on the gate insulating film 27 is arranged the transparent pixel electrode 5, which is an ITO film composed of $In_2O_3$ and SnO. The drain electrode 29 of the TFT is in direct contact (for electrical connection) with the transparent pixel electrode 5.

When the gate electrode 26 is supplied with a gate voltage through the scanning wiring 25, the TFT 4 becomes on. In this on state, the driving voltage previously supplied to the signal 34 wiring causes current to flow from the source electrode 28 to the transparent pixel electrode 5 through the drain electrode 29. As the transparent pixel electrode 5 is supplied with the driving voltage at a prescribed level, a potential difference occurs between the transparent pixel electrode 5 and the facing electrode 2. This potential difference orients the liquid crystal molecules in the liquid crystal layer 3, thereby bringing about light modulation.

In the conventional TFT substrate 1, the source-drain wiring 34 (which is electrically connected with the source-drain electrodes) and the scanning wiring 25 (which is electrically connected with the gate electrode 26) are formed from a thin film of aluminum alloy (such as Al—Nd) for easy fabrication. However, recent liquid crystal displays becoming larger than before pose a problem with an RC delay in wiring (or delayed transmission of electric signals). This has created a need for a wiring material having a low electric resistance. A promising candidate is copper, which has a lower electric resistance than aluminum alloys such as the one containing 2.0 atom % Nd.

Wirings with pure copper or copper alloy for the source-drain wring 34, the gate electrode 26, and the scanning wiring 25 are usually backed with the barrier metal layers 51, 52, and 53, respectively, of high-melting metal such as Mo, Cr, Ti, and W, as shown in FIG. 2. Technologies relating to the source-drain electrodes with such barrier metal layers are disclosed in Patent Documents 1 to 6. The disclosed wiring typically has a dual layer structure composed of a 50-nm thick layer of molybdenum (as the lower barrier metal layer) and a 250-nm thick layer of pure copper or copper alloy, which are formed sequentially on top of the other.

The lower barrier metal layer 53 (shown in FIG. 2), which is interposed between the amorphous silicon channel layer 33 and source-drain wiring 34 of pure copper or copper alloy, is intended to prevent mutual diffusion of silicon and copper through the interface between the thin film of pure copper or copper alloy and the amorphous silicon channel layer.

Without the lower barrier metal layer 53, copper diffuses into amorphous silicon and silicon diffuses into copper, or copper and silicon react with each other in the interface, during heat treatment, such as sintering and annealing, that is performed after direct contact is established between the thin film of pure copper or copper alloy and the amorphous silicon channel layer in the later stage of TFT manufacturing process. Such diffusion remarkably deteriorates the performance of amorphous silicon semiconductor, resulting in a reduced on-current, an increased leak current that flows while the TFT is off, a reduced switching speed of the TFT, and defective etching (which leads to difficulties in TFT manufacture and poor TFT performance). These drawbacks are eliminated by the lower barrier metal layer 53.

Another function of the lower barrier metal layer 53 is improved adhesion between the amorphous silicon channel layer 33 and the wiring layer of pure copper or copper alloy. Without it, they separate from each other, resulting in broken wiring, due to poor adhesion.

Unfortunately, the forming of the lower barrier metal layer 53 needs an apparatus for forming the wiring of pure copper or copper alloy as well as an apparatus for forming the barrier metal layer. Such an apparatus is composed of a plurality of film-forming chambers joined together by transfer chambers. Additional production cost and reduced productivity caused by the barrier metal layer cannot be slighted as liquid crystal display units decrease in price owing to mass production.

As mentioned above, the lower barrier metal layer can be formed only with additional film-forming chambers for the gate electrode, the source-drain electrodes, and the barrier metal layer. This leads to increased production cost and reduced productivity.

The foregoing has aroused an interest in the technology that eliminates the necessity of the barrier metal layer and also in the wiring material that permits direct connection between the source-drain electrodes and the semiconductor layer (or the amorphous silicon channel layer). Patent Documents 7 to 11 disclose the technology of eliminating the barrier metal layer in the case where the wiring material is pure aluminum or aluminum alloy instead of pure copper or copper alloy.

Although the foregoing is concerned typically with liquid crystal display units, the same problems as mentioned above are involved not only in liquid crystal display units but also in amorphous silicon TFT substrates. In addition, the above-mentioned problems are involved also in TFT substrates in which the semiconductors layer for TFT is either amorphous silicon or polycrystalline silicon.

Patent Document 1:
Japanese Patent Laid-open No. Hei-7-66423
Patent Document 2:
Japanese Patent Laid-open No. 2001-196371
Patent Document 3:
Japanese Patent Laid-open No. 2002-353222
Patent Document 4:
Japanese Patent Laid-open No. 2004-133422
Patent Document 5:
Japanese Patent Laid-open No. 2004-212940
Patent Document 6:
Japanese Patent Laid-open No. 2005-166757
Patent Document 7:
Japanese Patent Laid-open No. Hei-11-337976
Patent Document 8:
Japanese Patent Laid-open No. Hei-11-283934
Patent Document 9:
Japanese Patent Laid-open No. Hei-11-284195
Patent Document 10:
Japanese Patent Laid-open No. 2004-214606
Patent Document 11:
Japanese Patent Laid-open No. 2003-273109

OBJECT AND SUMMARY OF THE INVENTION

The present invention was completed in view of the foregoing. It is an object of the present invention to provide a TFT substrate which exhibits good characteristic properties despite the omission of the barrier metal layer to be normally interposed between the source-drain electrodes and the semiconductor layer in the TFT. The TFT substrate permits sure and direct connection with the semiconductor layer of the TFT.

The gist of the present invention resides in a thin film transistor substrate including a substrate, a semiconductor layer and source-drain electrodes, wherein said source-drain electrodes are composed of an oxygen-containing layer and a thin film of pure copper or a copper alloy, said oxygen-containing layer containing oxygen such that part or all of oxygen combines with silicon in said semiconductor layer, and said thin film of pure copper or a copper alloy connecting with said semiconductor layer through said oxygen-containing layer.

According to a preferred embodiment, oxygen in the oxygen-containing layer combines with silicon such that the atomic ratio of oxygen to silicon ([O]/[Si]) has a maximum value ranging from 0.3 to 2.0.

According to a preferred embodiment, the oxygen-containing layer, in which the maximum value of [O]/[Si] ratio is from 0.3 to 2.0, has a thickness ranging from 0.17 nm to 3 nm.

According to a preferred embodiment, the semiconductor layer is that of amorphous silicon or polycrystalline silicon.

The display device according to the present invention is equipped with the thin film transistor substrate defined above.

EFFECT OF THE INVENTION

The thin film transistor substrate constructed as mentioned above exhibits good TFT characteristics even though it has no barrier metal layer between the source-drain electrodes and the semiconductor layer unlike the conventional one.

According to the present invention, the wiring material for the source-drain electrodes is a Cu—X alloy, where X denotes at least one species of elements selected from the group consisting of Ni, Zn, Mg, Mn, Pt, Pd, Ir, Ge, Nb, Cr, and rare earth elements.

The thin film transistor substrate according to the present invention permits economical production of high-performance display devices.

BRIEF DESCRIPTION OF THE DRAWINGS

FIG. 6 is a graphical representation showing the results of GD-OES analyses in Example 1.

DESCRIPTION OF THE PREFERRED EMBODIMENTS

The present inventors had carried out investigation to provide a new thin film transistor substrate which has the source-drain electrodes for direct connection with the TFT semiconductor layer. To be specific, the thin film transistor substrate is expected to exhibit good TFT characteristics even though no barrier metal layer is interposed between the source-drain electrodes and the semiconductor layer unlike the conventional one.

The investigation showed that the object is achieved if the wiring for the source-drain electrodes is formed from a material composed of an oxygen-containing layer and a thin film of pure copper or copper alloy (referred to as copper thin film for short hereinafter) and part or all of oxygen in the oxygen-containing layer combines with silicon in the semiconductor layer of the thin film transistor (alternatively, the surface layer of the semiconductor layer is partly oxidized). This finding led to the present invention. The foregoing structure permits the copper thin film to connect directly with the semiconductor layer of the TFT through the oxygen-containing layer.

In this specification, the term "source-drain electrodes" embraces both the source-drain electrodes per se and the source-drain wiring. In other words, according to the present invention, the source-drain electrodes denote an integral entity of the source-drain electrodes and the source-drain wiring, and the source-drain wiring is in contact with the region of the source-drain electrodes.

(Source-Drain Electrodes Used in the Present Invention)

Figure 7:
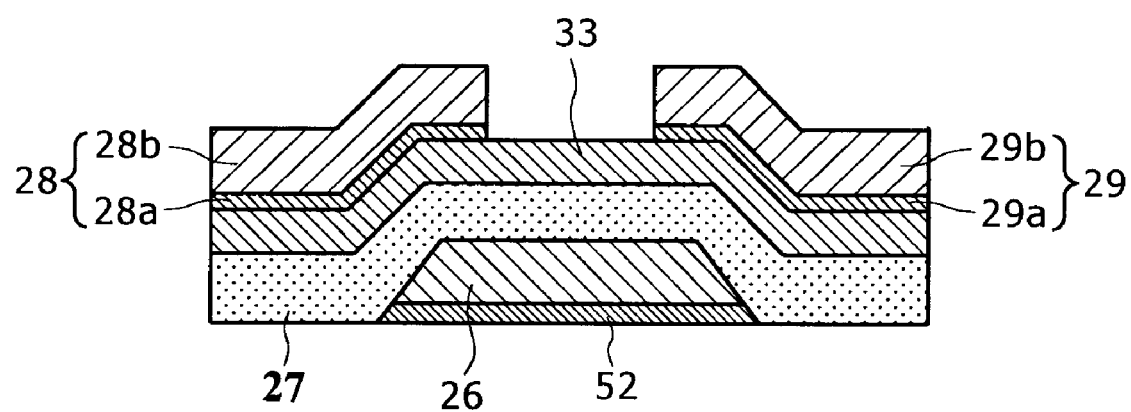
FIG. 7 is a schematic diagram illustrating the structure of the source-drain electrodes pertaining to the present invention.

As shown in FIG. 7, the source-drain electrodes 28 and 29 used in the present invention consist of the oxygen-containing layers 28a and 29a and the copper thin films 28b and 29b. The oxygen-containing layers 28a and 29a are so formed as to cover the semiconductor layer 33 of the TFT, and it contains oxygen such that part or all of oxygen atoms (O) therein combines with silicon atoms in the semiconductor layer. Oxygen atoms constituting the oxygen-containing layer combine more easily with copper than with silicon constituting the semiconductor layer. Consequently, the electrodes hardly peel off after patterning. Moreover, the oxygen-containing layers 28a and 29a function as a barrier that prevents mutual diffusion of copper and silicon in the interface between the copper thin films 28b and 29b and the semiconductor layer 33 of the TFT.

The TFT according to the present invention exhibits good characteristic properties even though it has no barrier metal layer of molybdenum or the like unlike the conventional one, as demonstrated in Examples given later. In addition, it does not need any special film-forming apparatus for the barrier metal layer unlike the conventional one because the oxygen-containing layer can be formed easily and simply by plasma CVD after the semiconductor layer has been formed and before the copper thin film is formed, as explained in more detail later.

A detailed description is given below of the oxygen-containing layer characteristic of the present invention.

Part or all of oxygen atoms in the oxygen-containing layer combines with silicon atoms in the semiconductor layer to form silicon oxides ($SiO_x$). The silicon oxides are formed as the surface of the silicon semiconductor layer is oxidized.

The oxygen-containing layer (or silicon oxide film) more readily adheres to the copper thin film than amorphous silicon (a-Si). The silicon oxide film is slightly inferior in adhesion to high-melting metal (such as molybdenum) typically used for the barrier metal layer; however, it has been found that the degree of adhesion is practically acceptable.

The degree of adhesion was evaluated by observing film samples (listed below) patterned by photolithography.

Conventional laminate film composed of pure copper and pure molybdenum (which was formed by sequentially depositing a film of pure molybdenum (50 nm thick) and a film of pure copper (250 nm thick) on an amorphous silicon layer free of oxygen in the same chamber).

Film of pure copper free of oxygen (in Comparative Example 1 given later).

Film of pure copper with the oxygen-containing layer (silicon oxide) (in Example 2 given later).

The results are as follows. The conventional laminate film gave the wiring of pure molybdenum and the wiring of pure copper, which are different in width due to difference in their etching rate. And the resultant wiring has a stepped cross section, although no residues were found on the substrate surface. The film in Comparative Example 1 gave the wiring with a stepless cross section, but it left etching residues on the entire surface of the substrate. By contrast, the film in Example 2 gave the wiring in good shape without etching residues.

The samples of patterned wiring obtained as mentioned above were allowed to stand at room temperature to see their durability. The sample in Comparative Example 1 suffered peeling after several days, whereas the conventional sample and the sample in Example 2 remained intact for several months.

The foregoing results show that the film of pure copper with the oxygen-containing layer is superior in adhesion to the amorphous silicon layer to the conventional copper film without the oxygen-containing layer.

The oxygen-containing layer mentioned above should preferably meet the following requirements.

The amount of oxygen in the oxygen-containing layer should be such that the atomic ratio ([O]/[Si]) of oxygen to silicon ranges from 0.3 to 2.0. With this requirement satisfied, the oxygen-containing layer exhibits the barrier action effectively. The atomic ratio should preferably be larger than 0.4, more preferably larger than 0.5, and most desirably larger than 0.7.

The lower limit (0.3) of the atomic ratio was established to prevent diffusion due to oxidation of the surface of the amorphous silicon layer. The upper limit (2.0) of the atomic ratio was established assuming the atomic ratio of $SiO_2$ (which is 2.0).

The maximum value of the atomic ratio can be controlled by performing plasma irradiation for 1 second to 10 minutes in the process of forming the oxygen-containing layer.

The atomic ratio is calculated from the amount of oxygen and silicon (in the depthwise direction of the oxygen-containing layer) which is determined by RBS method (Rutherford Backscattering Spectrometry).

The oxygen-containing layer should preferably have a thickness ranging from 0.17 nm to 3 nm. The lower limit (0.17 nm) approximately corresponds to the interatomic distance of the Si—O linkage in $SiO_2$. Moreover, the thickness mentioned above means the thickness of the layer in which the atomic ratio is no smaller than 0.3. The thickness of the layer in which the atomic ratio is smaller than 0.3 is excluded.

As mentioned above, the oxygen-containing layer functions as a barrier layer to prevent mutual diffusion of copper and silicon through the interface between the copper thin film and the TFT semiconductor layer. It functions as a barrier satisfactorily so long as it is formed on the surface of the TFT semiconductor layer in a thickness of monoatomic layer (in terms of $SiO_x$). With an excessive thickness, the oxygen-containing layer causes voltage drop across the interface between the copper thin film and the semiconductor layer, thereby decreasing on-current and deteriorating the TFT characteristics. With an adequate thickness as defined above, the oxygen-containing layer keeps low the increase in electric resistance in the interface between the copper thin film and the semiconductor layer and minimizes its adverse effect on the TFT characteristics. The thickness of the oxygen-containing layer should be no larger than 3 nm, preferably no larger than 2.7 nm.

The thickness of the oxygen-containing layer can be measured by any of RBS (mentioned above), XPS (X-ray photoelectron spectroscopy), SIMS (secondary ion mass spectrometry), and GD-OES (high-frequency glow discharge optical emission spectroscopy).

The oxygen-containing layer can be formed by oxidizing the top of the semiconductor layer. Method for oxidation is not specifically restricted. Plasma oxidation or thermal oxidation may be used, for example.

Plasma oxidation may be accomplished in an atmosphere of oxygen alone or oxygen diluted with argon (or any other inert gas). The oxygen plasma source may be supplied with oxygen ions (for ion injection method).

Thermal oxidation may be accomplished by heating the silicon semiconductor layer in an atmosphere of oxygen alone or oxygen diluted with argon (or any other inert gas).

The oxygen-containing layer may form spontaneously in the step of forming the source-drain electrodes due to diffusion of oxygen atoms from the surface of the silicon semiconductor layer into the copper thin film. Such natural diffusion may be used to form the oxygen-containing layer.

The methods for plasma oxidation and thermal oxidation will be described below in more detail.

(i) Plasma Oxidation Method

This method employs plasma and oxygen-containing gas, as demonstrated in Embodiment and Example 1 given later. The oxygen-containing gas includes $O_2$, $H_2O$, and $N_2O$. They may be used alone or in combination with one another. The semiconductor layer of the TFT should be placed in the vicinity of the plasma source containing oxygen. The distance between the plasma source and the semiconductor layer varies depending on the kind of plasma and the condition of plasma generation (electric power supplied, pressure, temperature, duration of irradiation, and gas composition). It is usually tens of centimeters. There exist high-energy oxygen atoms near the plasma and they easily form the oxygen-containing layer on the surface of the semiconductor layer.

Oxygen supply from the oxygen-containing plasma source may be accomplished by using the ion injection method. The ion injection method makes it possible to establish an arbitrary distance between the plasma source and the semiconductor layer because ions accelerated by the electric field move over a long distance. The ion injection method should be carried out in such a way that negative high-voltage impulses are applied to the semiconductor layer placed near the plasma, so that ions are injected into the entire surface of the semiconductor layer. Ion injection may also be accomplished by using a dedicated ion injection apparatus.

Plasma oxidation should be carried out at 300° C. or above. At temperatures below 300° C., oxidation is slow and takes a long time to form the oxygen-containing layer thick enough to function as the diffusion barrier, and the resulting TFT is poor in characteristic properties. Oxidation at an excessive high temperatures is detrimental to the semiconductor layer. An adequate oxidation temperature is below about 360° C.

Plasma oxidation should be carried out at a pressure no lower than 55 Pa. At a pressure lower than 55 Pa, oxidation is slow and takes a long time to form the oxygen-containing layer thick enough to function as the diffusion barrier. At a high pressure, oxidation proceeds rapidly, with a minimum damage to the semiconductor layer, to form the oxygen-containing layer that exhibits good barrier properties, and the resulting TFT has good characteristic properties. For the reasons mentioned above, the pressure should be no lower than 60 Pa, preferably no lower than 66 Pa. Incidentally, the upper limit of pressure cannot be simply defined because it depends on the performance of the apparatus employed. It is lower than 400 Pa, preferably lower than 266 Pa, from the standpoint of stable plasma supply.

Duration of plasma irradiation should be less than 5 minutes, preferably less than 3 minutes, more preferably less than 1 minute. Prolonged plasma treatment forms an excessively thick oxygen-containing layer on the surface of the amorphous silicon layer which causes an appreciable voltage drop to deteriorate the TFT characteristic properties. The minimum duration of plasma irradiation is 1 second, preferably 5 seconds, which is long enough to form the oxygen-containing layer with a monoatomic thickness on the surface of the amorphous silicon layer. Such a thin layer fully produces the effect of the present invention. Examples given later show that plasma irradiation for about 5 seconds gives rise to a satisfactory diffusion barrier layer.

The input electric power should be no less than 50 W, preferably no less than 60 W, more preferably no less than 75 W. An input electric power less than 50 W is not enough for oxidation to proceed at an adequate rate and to produce the oxygen-containing layer having an adequate [O]/[Si] ratio. In this case it takes a long time to form the oxygen-containing layer that effectively functions as a diffusion barrier layer, and the resulting TFT is poor in characteristic properties.

The oxidizing gas may be an oxygen-containing gas (such as $O_2$, $H_2O$, and $N_2O$ as mentioned above), which is used alone or diluted with an inert gas such as argon.

(ii) Thermal Oxidation Method

This method is generally used because it forms a firmly adhering oxide film. Thermal oxidation should be carried out by heating in an atmosphere of oxygen at a temperature no higher than 400° C. An adequate heating temperature is 200° C. to 380° C., preferably 250° C. to 350° C. Oxidation at an excessively high heating temperature is detrimental to the semiconductor layer. Oxidation at an excessively low heating temperature does not form the oxygen-containing layer as desired. This thermal oxidation method may be used in combination with the foregoing plasma oxidation method to promote the formation of the oxygen-containing layer.

The oxygen-containing layer is formed by any of the above-mentioned methods (i) and (ii). For a simple and rapid oxidation process, it is desirable to control the apparatus, chamber, temperature, and gas composition as follows.

In order to simplify the process, it is desirable that the apparatus for forming the semiconductor layer be used in common for thermal oxidation. Sharing the same apparatus eliminates the transfer of works in the apparatus or from one apparatus to another.

The temperature for oxidation should be substantially the same as that at which the semiconductor layer is formed. In this way it is possible to save time necessary for temperature adjustment.

The gas composition may be an oxygen-containing gas diluted with an inert gas such as argon.

A detailed description has been made above of the method for forming the oxygen-containing layer.

After the oxygen-containing layer has been formed on the semiconductor layer of the TFT, the copper thin film is formed by sputtering to give the desired source-drain electrodes. According to the present invention, the source-drain electrodes can be formed by using a single sputtering target and a single sputtering gas. This means that it is not necessary to change the composition of the sputtering gas, unlike Patent Document 11. Thus the process according to the present invention is simpler than the conventional one.

According to the present invention, the source-drain electrodes are characterized in that the oxygen-containing layer (mentioned above) is interposed between the semiconductor layer of the TFT and the copper thin film such that it covers the semiconductor layer of the TFT. This structure does not restrict the type of the semiconductor layer normally used for the source-drain electrodes so long as it has no adverse effect on the TFT characteristics.

The semiconductor layer is typically that of amorphous silicon (preferably hydrogenated amorphous silicon) or that of polycrystalline silicon.

The wiring for the source-drain electrodes may be formed from pure copper (which is generally used in the conventional technology).

The wiring for the source-drain electrodes may also be formed from a copper alloy containing at least one species selected from the group consisting of Ni, Zn, Mg, Mn, Pt, Pd, Ir, Ge, Nb, Cr, and rare earth elements.

The TFT substrate having the source-drain electrodes mentioned above dispenses with the lower metal layer interposed between the TFT semiconductor layer and the copper thin film, unlike the conventional one. It permits the copper thin film to connect with the semiconductor layer through the oxygen-containing layer. As shown in Examples that follow, the TFT with a thin film of pure copper or copper alloy outperforms the conventional TFT which has a barrier metal layer of chromium or the like. The omission of the barrier metal layer simplifies the manufacturing process and saves the production cost.

The TFT module in its preferred embodiment according to the present invention will be described below with reference to the accompanying drawings. The following description assumes that the TFT module is an amorphous silicon TFT substrate used for liquid crystal displays. It is not intended to restrict the scope of the present invention, within which it may be changed or modified as required. Experiments proved that the source-drain electrodes according to the present invention can also be applied to the TAB connecting electrode for input and output of external signals.

Embodiment

Figure 2:
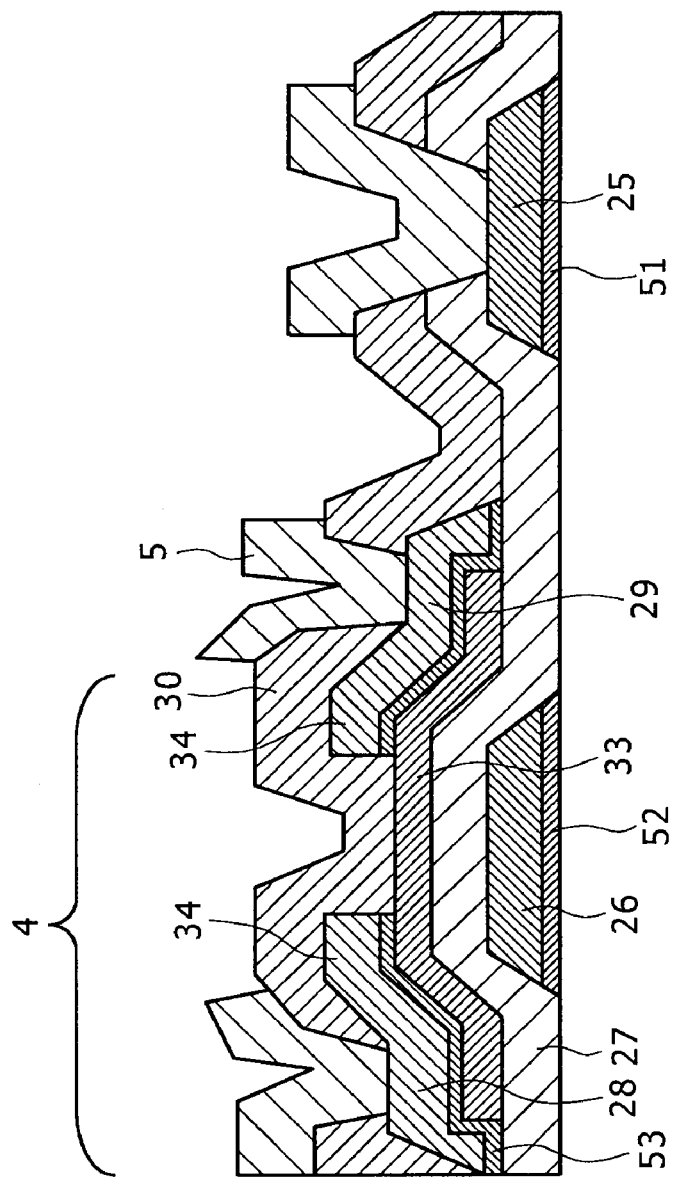
FIG. 2 is a schematic sectional view showing the structure of the conventional typical amorphous silicon TFT substrate.
Figure 3:
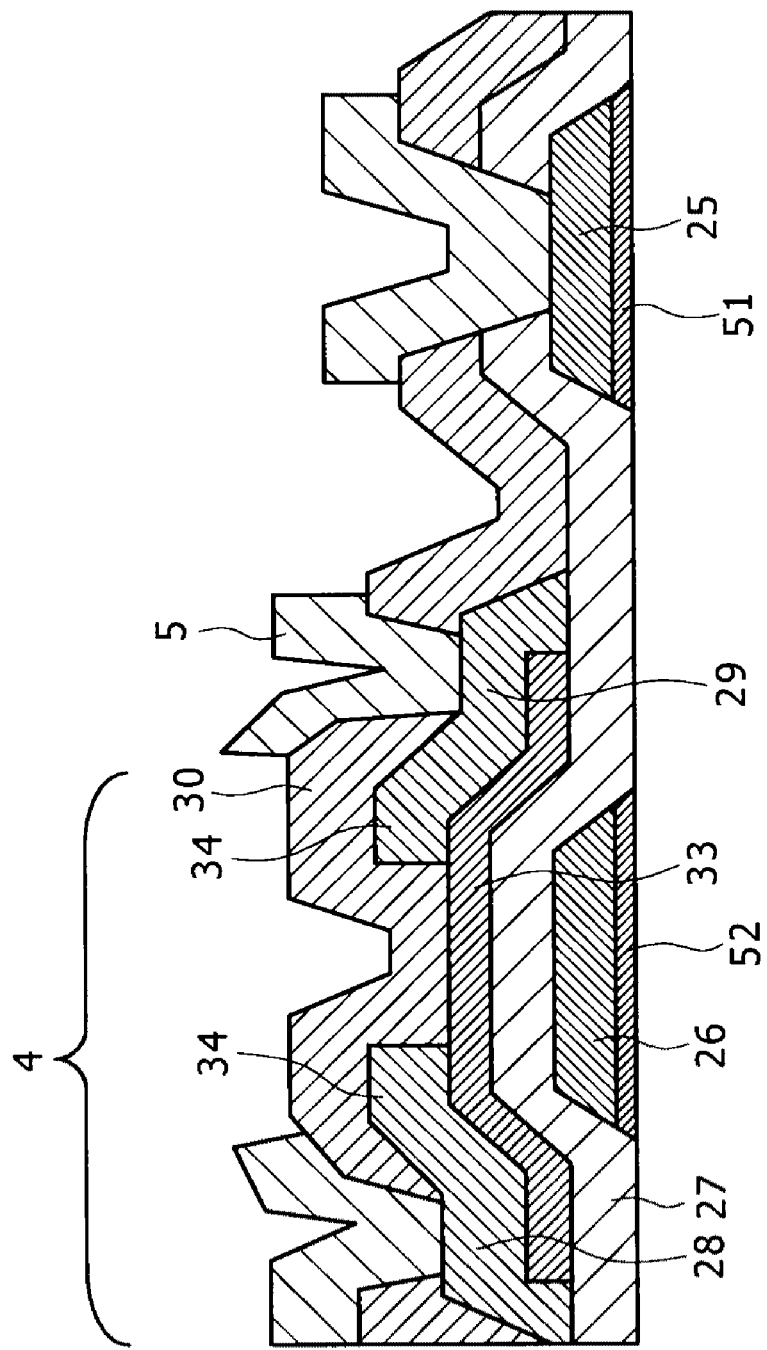
FIG. 3 is a schematic sectional view showing the structure of the TFT substrate pertaining to the present invention.

FIG. 3 is a schematic sectional view illustrating an embodiment of the amorphous silicon TFT substrate according to the present invention. It employs reference numerals common to those in FIG. 2. This embodiment shows that the oxygen-containing layer is formed as explained below in more detail.

There are shown in FIG. 3 the source electrode 28 and the drain electrode 29 which are electrically connected to the source-drain wiring 34 composed of an oxygen-containing layer and a thin film of pure copper or copper alloy. (The copper alloy contains 0.5 atom % Mn, 0.34 atom % Ni, 1.3 atom % Zn, or 1.0 atom % Mg.) The oxygen-containing layer is so formed as to cover the amorphous silicon channel layer 33. The source-drain wiring 34 is constructed as shown in FIGS. 4(e) and 4(f).

The conventional TFT substrate shown in FIG. 2 has the lower barrier metal layer 53 of molybdenum under the source-drain electrodes, whereas the TFT module according to the present invention shown in FIG. 3 does not have it.

The TFT substrate according to the embodiment mentioned herein permits the copper thin film to connect directly with the amorphous silicon channel layer via the oxygen-containing layer, with the lower barrier metal layer being omitted, unlike the conventional one. Nevertheless, it exhibits as good TFT characteristics as the conventional one. (See Examples given later.)

The TFT substrate (shown in FIG. 3) according to the embodiment mentioned herein is produced by the process shown in FIG. 4. Common reference numerals are used in FIG. 3 and FIG. 4.

Figure 4A:
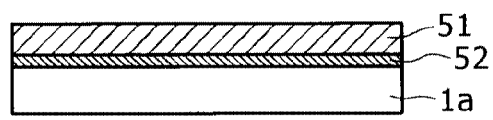
FIG. 4 is a diagram illustrating the steps of producing the TFT substrate shown in FIG. 3.
Figure 4B:
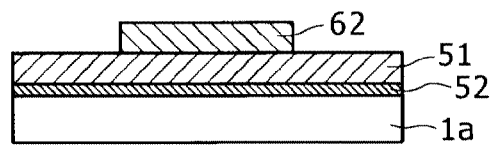
Figure 4C:
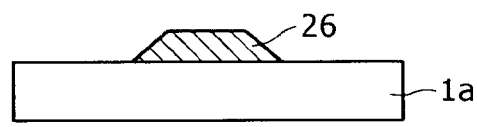

As shown in FIG. 4(a), the process starts with coating the glass substrate 1a sequentially with the thin film 52 of pure molybdenum (about 50 nm thick) and the thin film 61 of copper alloy (about 200 nm thick) by sputtering. The copper alloy is one that contains 0.5 atom % Mn, 0.34 atom % Ni, 1.3 atom % Zn, or 1.0 atom % Mg. Sputtering is performed at room temperature. Then, as shown in FIG. 4(b), the laminate of thin films 52 and 61 is coated with the resist 62, which is subsequently patterned by photolithography. The laminate of thin films 52 and 61 undergoes etching through the resist 62 as a mask. This etching gives rise to the gate electrode 26, as shown in FIG. 4(c). Incidentally, this etching is carried out such that the remaining layer has sloped edges (about 30° to 60°). Such sloped edges contribute to complete covering with the gate insulating film 27 to be formed later.

Figure 4D:
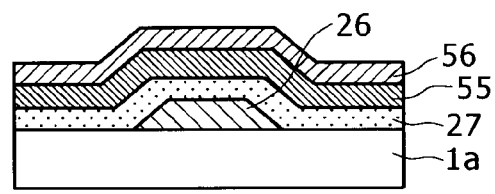
Figure 4E:
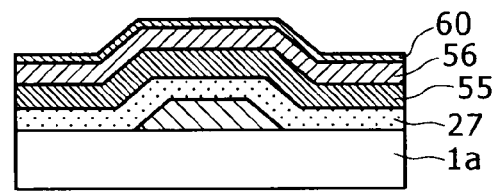
Figure 4F:
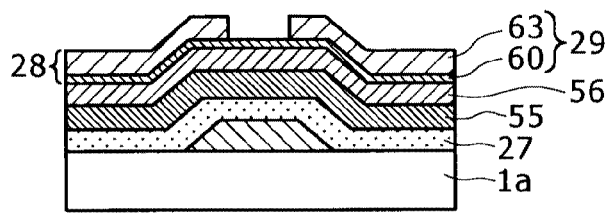

In the next step, the silicon nitride film (gate insulating film) 27, about 300 nm thick, is formed by plasma CVD (at about 350° C.), as shown in FIG. 4(d). Then, it is covered sequentially with the undoped hydrogenated amorphous silicon film (a-Si—H) 55, about 200 nm thick, and the phosphorus-doped n-type hydrogenated amorphous silicon film (n$^+$ a-Si—H) 56, about 80 nm thick, by plasma CVD. Plasma CVD for the doped film employs $SiH_4$ and $PH_3$ as the reactant gases.

The n$^+$-type hydrogenated amorphous silicon film (n$^+$ a-Si—H) 56 is coated with the oxygen-containing layer 60, as shown in FIG. 4(e), in the same plasma CVD apparatus as used to form the silicon nitride film. Specifically, the chamber holding the substrate is freed of the reactant gas for the amorphous silicon film and then supplied with oxygen as the carrier gas. Plasma is generated in the chamber to treat the surface of the n$^+$-type hydrogenated amorphous silicon film 56 for 30 seconds, thereby forming the oxygen-containing layer, under the following conditions. RF power density: 0.14 W/cm$^2$, film forming temperature: 320° C., and gas pressure: 133 Pa.

Analyses by RBS and XPS revealed that oxygen atoms are present in the surface of the oxygen-containing layer thus obtained, and analyses by RBS revealed that the oxygen-containing layer is about 2.5 nm thick in which the atomic ratio of oxygen atoms and silicon atoms is greater than 0.3.

The embodiment mentioned herein employs the plasma oxidation method to form the oxygen-containing layer 60; however, it is shown that the same result is attained also by the thermal oxidation method.

In the next step shown in FIG. 4(f), the oxygen-containing layer 60 is coated by sputtering with the thin film 63 of copper alloy, about 300 nm thick. The copper alloy is one that contains 0.5 atom % Mn, 0.34 atom % Ni, 1.3 atom % Zn, or 1.0 atom % Mg. Sputtering is performed at room temperature. The thin film 63 of copper alloy undergoes etching through a resist mask which has been patterned by photolithography. Thus the source electrode 28 and the drain electrode 29 are formed. (See FIG. 4(f).) Using the source and drain electrodes 28 and 29 as a mask, dry etching is performed to remove the n$^+$ type hydrogenated amorphous silicon film 56. (See FIG. 4(g).)

In the next step (not shown), the silicon nitride film (protective film) 30, about 300 nm thick, is formed at about 250° C. by using a plasma nitriding apparatus. The contact hole 57 is formed by dry etching through a patterned resist formed on the silicon nitride film 30.

The resist (not shown) is removed by using an amine remover. Finally, an ITO film, about 50 nm thick, is formed. (ITO is indium oxide doped with 10 mass % tin oxide.) The ITO film is patterned by wet etching. Thus the transparent pixel electrode 5 is formed and the TFT is completed.

The embodiment mentioned herein is intended for the TFT substrate in which the amorphous silicon channel layer is connected to the thin film of copper alloy via the oxygen-containing layer. (The copper alloy is defined as above.)

The ITO film as the transparent pixel electrode 5 may be replaced by an IZO film. Also, the amorphous silicon for the active semiconductor layer may be replaced by polycrystalline silicon.

Figure 1:
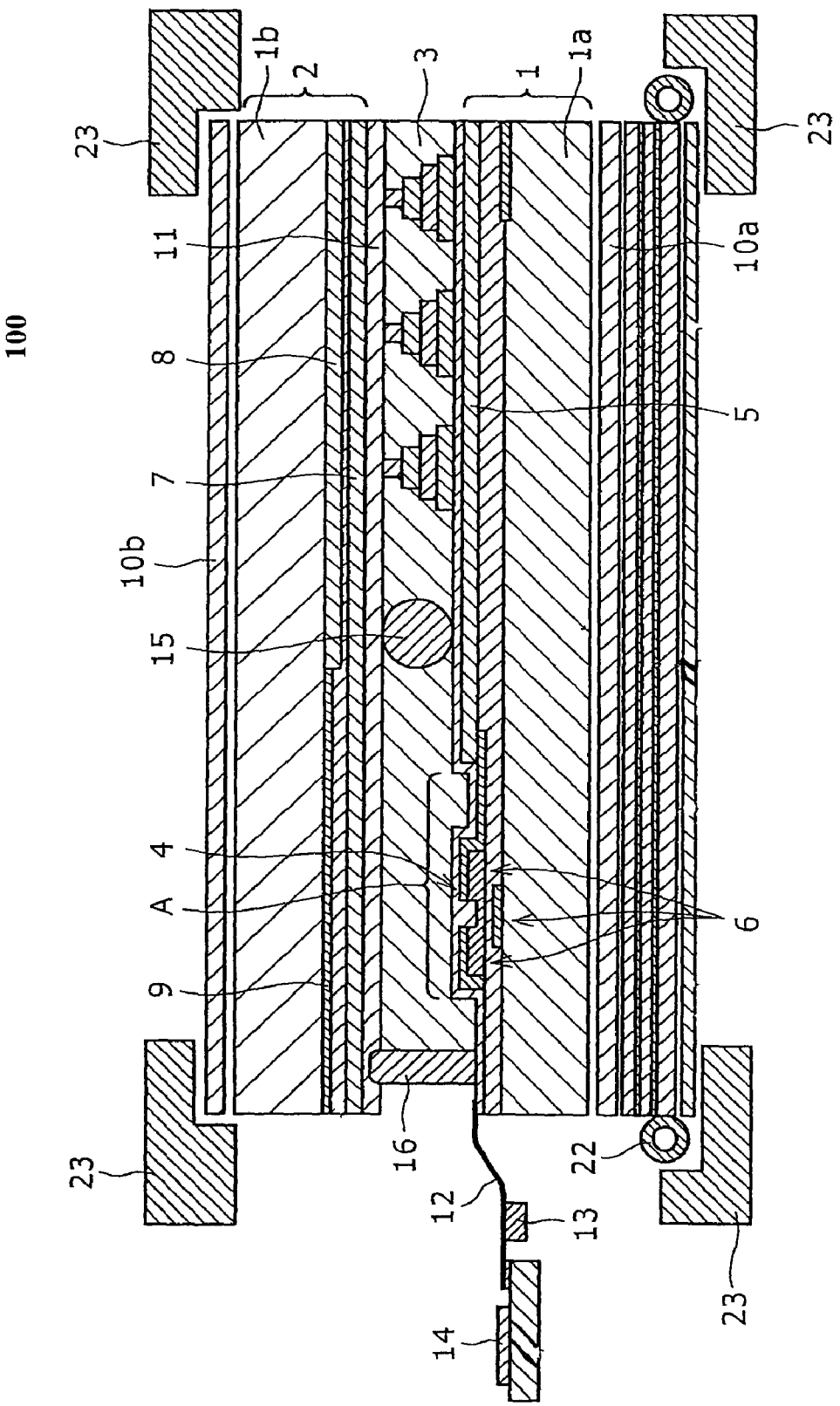
FIG. 1 is a schematic enlarged sectional view showing the structure of the typical liquid crystal display to which the amorphous silicon TFT substrate is applied.

The thus obtained TFT substrate is used to form the liquid crystal display shown in FIG. 1 in the following manner.

The surface of the TFT substrate is coated with polyimide. After drying, the polyimide film is made into an alignment layer 11 by rubbing.

The facing substrate 2 is provided with the light shielding film 9 which is a chromium film in a checkerboard pattern. The gaps between individual pieces of the light shielding film are filled with resin color filters 8 in red, green, and blue color. The light shielding film 9 and the color filter 8 are coated with a transparent conductive film (e.g., ITO film) which functions as the common electrode 7 (or the opposite electrode). The surface of the opposite electrode is coated with polyimide. After drying, the polyimide film is made into the alignment layer 11 by rubbing.

The TFT substrate 1 and the facing substrate 2 are placed on top of the other, with their alignment layers inside. They are joined together by the resin sealing material 16, with the spacers 15 placed between them to ensure a certain distance (cell gap) between them. The sealing material is partly absent at the inlet through which the liquid crystal is introduced.

The resulting empty cell is placed in a vacuum chamber, with the inlet immersed in the liquid crystal. The reduced pressure in the vacuum chamber is gradually restored to the atmospheric pressure, so that the empty cell is filled with the liquid crystal. The inlet is sealed. Finally, the filled cell is provided with the polarizers 10 on its outer sides. Thus the liquid crystal panel is completed.

The liquid crystal panel is provided (at its side or rear) with the driver circuit 13 which is electrically connected thereto. It is held by the upper and lower frames 23 and 23. The upper frame 23 has the opening for the liquid crystal display. The lower frame 23 also holds the back light 22 and the light guide plate 23. Thus the liquid crystal display is completed.

The display device according to the present invention has the source-drain electrodes as mentioned above, so that it exhibits outstanding performance and reliability. It is not specifically restricted in its structure so long as it has the source-drain electrodes specified above. It may have any structure known in the field of display device.

EXAMPLES

Examples 1 and 2 and Comparative Example 1

Examples 1 and 2 mentioned herein are intended to prove that the TFT exhibits good characteristics without diffusion of copper into the semiconductor layer so long as it has the source-drain electrodes in the form of thin film of copper alloy having the oxygen-containing layer even though it has no barrier metal layer. In these examples, the oxygen-containing layer is formed by plasma oxidation in the same way as in Embodiment mentioned above. Typical experimental conditions and evaluation methods are as follows.

(Source-Drain Electrodes)

In Example 1, the wiring for the source-drain electrodes is formed from a copper alloy containing 0.5 atom % Mn which is used in Embodiment mentioned above.

In Example 2, the wiring for the source-drain electrodes is formed from pure copper in place of copper alloy.

In Comparative Example 1, the wiring for the source-drain electrodes is formed from pure copper, without oxygen plasma treatment.

The TFTs in Examples 1 and 2 have the oxygen-containing layer, about 2.7 nm thick, in which the [O]/[Si] atomic ratio is greater than 0.3 (determined by RBS). By contrast, the TFT in Comparative Example 1 does not have the oxygen-containing layer.

(TFT Used for Experiments)

Figure 4G:
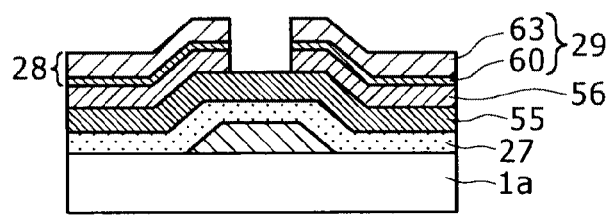

For easy examination of TFT characteristics, the TFT illustrated in FIG. 4(g) according to Embodiment was tested after heating at 150° C., 200° C., 250° C., and 300° C. for 30 minutes. This heating condition was established assuming the maximum temperature which would be encountered when the silicon nitride film (protective film) is formed. The TFT tested in Examples is not completed by various film-forming steps unlike the one in actual TFT substrates. However, it is considered that the TFT annealed as mentioned above has almost the same TFT characteristics as those of actual TFT substrates.

(Evaluation of Mutual Diffusion of Silicon and Copper)

The TFT shown in FIG. 4(g) according to Embodiment was prepared in each of Examples 1 and 2 and Comparative Example 1. The interface with the amorphous silicon channel layer was observed to see if there occurred mutual diffusion of silicon and copper in the amorphous silicon. Specifically, TFT samples with or without heat treatment at 350° C. for 30 minutes in an oxygen atmosphere were analyzed by GD-OES to determine the concentration of elements in the depthwise direction. GD-OES involves the scraping of the film by high-frequency sputtering under the following conditions.

Gas pressure: 300 Pa, electric power: 20 W, frequency: 500 Hz, and duty ratio: 0.125.

(Results of Evaluation of Mutual Diffusion of Silicon and Copper)

The results of analysis by GD-OES are shown in FIG. 5 (for Comparative Example 1 with pure copper alone) and FIG. 6 (for Example 1).

The results shown in FIG. 5 (for Comparative Example 1) are reviewed first.

Figure 5A:
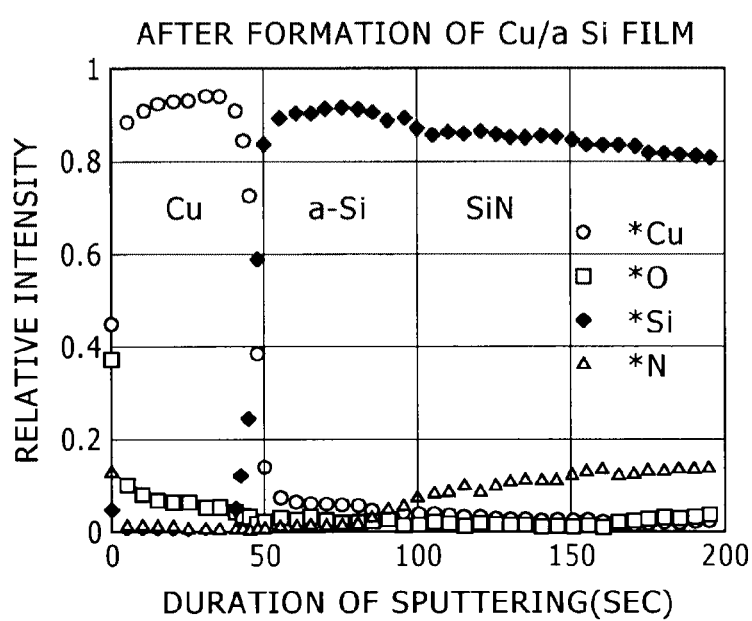
FIG. 5 is a graphical representation showing the results of GD-OES analyses in Comparative Example 1.
Figure 5B:
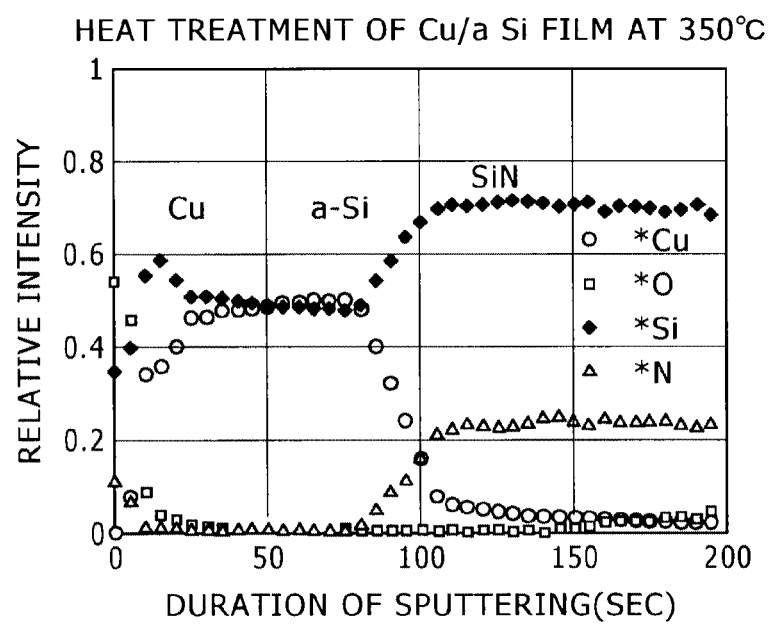

FIG. 5(a) shows the results of analysis performed on the TFT sample immediately after its preparation. FIG. 5(b) shows the results of analysis performed on the TFT sample after heat treatment at 350° C. for 30 minutes. The abscissa represents the duration (in seconds) of sputtering which corresponds to the depthwise distance from the surface. The ordinate represents the relative intensities due to copper atoms, oxygen atoms, silicon atoms, and nitrogen atoms.

It is apparent from FIGS. 5(a) and 5(b) that diffusion of copper atoms into amorphous silicon (a-Si) takes place upon heat treatment in the sample of Comparative Example 1 which does not have the oxygen-containing layer.

The results shown in FIG. 6 (for Example 1) are reviewed next.

It is apparent from FIGS. 6(a) and 6(b) that diffusion of copper atoms into amorphous silicon (a-Si) does not take place even upon heat treatment in the sample of Example 1 which have the oxygen-containing layer (with copper alloy containing 0.5 atom % manganese).

The same trend as mentioned above was also observed (although not shown) in the sample of Example 2 which has the oxygen-containing layer (with pure copper).

Additional experiments proved that the same results as shown in FIG. 6 are obtained from the samples in which the Cu—Mn alloy is replaced by any copper alloy containing at least one species of Ni, Zn, Mg, Pt, Pd, Ir, Ge, Nb, Cr, and rare earth elements.

Example 3

The same procedure as in Example 1 was repeated to produce the TFT except that the oxygen-containing layer was formed by plasma oxidation (which was performed for pure copper in Example 2) under different conditions shown in Table 1 (Conditions 1 to 7). The resulting TFT underwent heat treatment in the same way as in Example 1. For comparison, the TFT without heat treatment was also prepared. Oxidation under all the conditions employed oxygen as the carrier gas.

Conditions 1, 2, 4, 5, and 7 for plasma oxidation shown in Table 1 accord with the present invention. Condition 2 specifies a higher pressure and the condition 5 specifies a higher pressure, both within the preferred range required by the present invention. By contrast, condition 3 specifies a low pressure (38 Pa) and condition 6 specifies a long time (600 seconds), both outside the range established by the present invention.

The resulting TFT samples were examined for switching characteristics of drain current vs. gate voltage. Switching characteristics are an indirect measure of mutual diffusion of silicon and copper. They are expressed in terms of off-current (which flows when the TFT is off) and on-current (which flows when the TFT is on). Off-current is identical with leak current or drain current that flows when a negative voltage is applied to the gate electrode. On-current and off-current were measured in the following way.

A TFT with a gate length (L) of 300 μm and a gate width (W) of 20 μm is prepared, and it is examined for drain current and gate voltage, with the drain voltage maintained at 10 V. Off-current is defined as the drain current that flows when a gate voltage of −3 V is applied, and on-current is defined as the drain current that flows when the gate voltage reaches 20 V.

The TFT characteristic values thus measured were compared with conventional ones in the following manner. A conventional TFT prepared for comparison has the source-drain electrodes composed of a thin film of pure copper and a barrier metal layer of pure molybdenum. It gave an on-current of about $1 \times 10^{-6}$ A (or μA order) and an off-current smaller than $1 \times 10^{-11}$ A (or pA order). Those TFT samples with an off-current no larger than the above-mentioned standard value by one order of magnitude are rated as good (○), and those TFT samples with an off-current larger than the above-mentioned standard value are rated as poor (x). Those TFT samples with an on-current larger than the above-mentioned standard value depending on the conditions of heat treatment are rated as good (○), and those TFT samples with an on-current smaller than the above-mentioned standard value are rated as poor (x). An overall rating of good (○), fair (Δ), or poor (x) is given respectively to those TFT samples with both on-current and off-current rated as good, with either on-current or off-current rated as poor, or with both on-current and off-current rated as poor. In this Example, those TFT samples rated as good (○) or fair (Δ) are acceptable.

The results of rating are shown in Table 2.

The TFT samples prepared under conditions 2, 3, and 4 shown in Table 1 were examined for the [O]/[Si] ratio and the thickness of the oxygen-containing layer by using "HRBS500" which is a high resolution RBS analyzer produced by Kobe Steel Ltd. The results are not shown in Table 2. Incidentally, the thickness of the oxygen-containing layer is that which satisfies the [O]/[Si] ratio greater than 0.3.

TABLE 1

| Condition | Heating temperature (° C.) | Pressure (Pa) | Power (W) | Duration (seconds) |
|---|---|---|---|---|
| 1 | 320 | 67 | 100 | 60 |
| 2 | 320 | 133 | 100 | 60 |
| 3 | 320 | 38 | 100 | 600 |
| 4 | 320 | 67 | 200 | 60 |
| 5 | 320 | 67 | 50 | 60 |
| 6 | 320 | 67 | 100 | 30 |
| 7 | 320 | 67 | 100 | 180 |

TABLE 2

| Condition | No. | Heat treatment | On-current Measured value (μA) | Rating | Off-current Overall rating | Rating | Overall rating |
|---|---|---|---|---|---|---|---|
| 1 | 1 | none | 0.91 | ○ | 0.69 | x | Δ |
|   | 2 | 150° C. | 0.88 |   | 1.03 |   |   |
|   | 3 | 200° C. | 0.95 |   | 1.77 |   |   |
|   | 4 | 250° C. | 1.08 |   | 1.73 |   |   |
|   | 5 | 300° C. | 0.57 |   | 44.58 |   |   |
| 2 | 6 | none | 0.73 | ○ | 0.53 | ○ | ○ |
|   | 7 | 150° C. | 0.70 |   | 0.40 |   |   |
|   | 8 | 200° C. | 0.78 |   | 1.17 |   |   |
|   | 9 | 250° C. | 1.05 |   | 2.33 |   |   |
|   | 10 | 300° C. | 0.83 |   | 1.26 |   |   |
| 4 | 11 | none | 0.07 | x | 0.23 | ○ | Δ |
|   | 12 | 150° C. | 0.09 |   | 0.11 |   |   |
|   | 13 | 200° C. | 0.13 |   | 0.68 |   |   |
|   | 14 | 250° C. | 0.06 |   | 2.11 |   |   |
|   | 15 | 300° C. | 0 |   | 2.12 |   |   |
| 5 | 16 | none | 0.79 | ○ | 0.48 | ○ | ○ |
|   | 17 | 150° C. | 1.07 |   | 0.87 |   |   |
|   | 18 | 200° C. | 1.10 |   | 1.11 |   |   |
|   | 19 | 250° C. | 1.25 |   | 2.03 |   |   |
|   | 20 | 300° C. | 1.05 |   | 7.39 |   |   |
| 6 | 21 | none | 0.62 | x | 0.17 | x | x |
|   | 22 | 150° C. | 0.79 |   | 0.73 |   |   |
|   | 23 | 200° C. | 0.99 |   | 2.27 |   |   |
|   | 24 | 250° C. | 0.96 |   | 2.48 |   |   |
|   | 25 | 300° C. | 0.69 |   | 13.17 |   |   |
| 7 | 26 | none | 0.06 | x | 0.37 | ○ | Δ |
|   | 27 | 150° C. | 0.06 |   | 0.21 |   |   |
|   | 28 | 200° C. | 0.02 |   | 0.38 |   |   |
|   | 29 | 250° C. | 0.06 |   | 1.49 |   |   |
|   | 30 | 300° C. | 0.01 |   | 2.12 |   |   |

Table 2 invites the following discussion.

Samples Nos. 6 to 10 and Nos. 16 to 20 were prepared by plasma oxidation under conditions 2 and 5 according to the present invention. They exhibited as good TFT characteristics as conventional ones even though they underwent heat treatment. Incidentally, those samples which underwent plasma oxidation under condition 2 gave the [O]/[Si] value of 2.0. They also had the oxygen-containing layer with a thickness of 2.7 nm, which is satisfactory to prevent diffusion as desired.

Those samples prepared under conditions 1, 4, and 7 are slightly inferior in TFT characteristics to those samples prepared under conditions 2 and 5. This is due to lower power, longer plasma irradiation, and higher heating temperature.

Specifically, Samples Nos. 1 to 5 (under condition 1) shown in Table 2 are slightly inferior in TFT characteristics (off-current) to those samples prepared under conditions 2 and 5 on account of plasma oxidation with a slightly lower power (condition 1) and hence slow oxidation.

Samples Nos. 11 to 15 (under condition 4), which underwent plasma oxidation with a slightly longer duration, have a slightly thicker oxygen-containing layer (5.0 nm) than those samples which underwent plasma oxidation under condition 2, even though they have the [O]/[Si] ratio of 2.0. The thicker oxygen-containing layer is effective in diffusion prevention but increases in electric resistance at the interface, thereby slightly decreasing on-current.

Samples Nos. 26 to 30 (under condition 7) shown in Table 2 are slightly inferior in TFT characteristics (on-current) to those samples prepared under conditions 2 and 5 on account of plasma oxidation at a slightly higher heating temperature.

By contrast, those samples which underwent plasma oxidation under condition 3, with a pressure lower than the preferred range specified by the present invention, did not permit measurement of TFT characteristics because oxidation did not proceed sufficiently due to excessively low pressures and peeling occurred during patterning. Incidentally, the [O]/[Si] ratio measured before patterning was 0.25, which is outside the preferred range specified by the present invention.

Samples Nos. 21 to 25 (under condition 6) shown in Table 2 were poor in TFT characteristics because they underwent plasma oxidation for an excessively long time (600 seconds).

It is concluded from the foregoing discussion that those samples with the source-drain electrodes formed under the conditions of plasma oxidation within the preferred range specified by the present invention exhibit good TFT characteristics even though they have no barrier metal layer. This is because mutual diffusion of silicon and copper is effectively prevented in the interface between the amorphous silicon channel layer and the thin film of copper.

Example 4

The same procedure as in Example 1 was repeated to produce the TFT except that the source-drain electrodes were formed from a copper alloy shown in Table 3 in place of pure copper and the oxygen plasma treatment was carried out under the following conditions. (The copper alloy contains any of Ni, Zn, Mn, and Mg.) The resulting TFT underwent heat treatment in the same way as in Example 1. For comparison, the TFT without heat treatment was also prepared. Also, for comparison, experiments with the TFT having the source-drain electrodes of pure copper were carried out in the same way as mentioned above.

Conditions of Plasma Oxidation:

Temperature: 320° C., pressure: 133 Pa, input electric power: 100 W, duration of irradiation: 60 seconds, and carrier gas: oxygen.

The resulting TFT samples were examined for switching characteristics of drain current vs. gate voltage in the say was as in Example 3.

The results are shown in Table 3.

TABLE 3

| Source-drain electrodes | Heat treatment | On-current Measured value (μA) | Rating | Off-current Measured value (pA) | Rating | Overall rating |
|---|---|---|---|---|---|---|
| Pure copper | none | 0.73 | ○ | 0.53 | ○ | ○ |
|  | 150° C. | 0.70 |  | 0.40 |  |  |
|  | 200° C. | 0.78 |  | 1.17 |  |  |
|  | 250° C. | 1.05 |  | 2.33 |  |  |
|  | 300° C. | 0.83 |  | 1.26 |  |  |
| Cu—0.34 atom % Ni | none | 0.72 | ○ | 1.14 | ○ | ○ |
|  | 150° C. | 0.78 |  | 1.33 |  |  |
|  | 200° C. | 1.01 |  | 2.56 |  |  |
|  | 250° C. | 1.05 |  | 0.38 |  |  |
|  | 300° C. | 0.97 |  | 1.49 |  |  |
| Cu—1.3 atom % Zn | none | 0.76 | ○ | 2.12 | ○ | ○ |
|  | 150° C. | 0.82 |  | 0.87 |  |  |
|  | 200° C. | 0.88 |  | 1.11 |  |  |
|  | 250° C. | 1.03 |  | 2.11 |  |  |
|  | 300° C. | 0.92 |  | 2.12 |  |  |
| Cu—0.5 atom % Mn | none | 0.70 | ○ | 0.48 | ○ | ○ |
|  | 150° C. | 0.84 |  | 0.87 |  |  |
|  | 200° C. | 0.93 |  | 1.71 |  |  |
|  | 250° C. | 1.12 |  | 2.03 |  |  |
|  | 300° C. | 0.96 |  | 1.26 |  |  |
| Cu—1.0 atom % Mg | none | 0.88 | ○ | 0.23 | ○ | ○ |
|  | 150° C. | 0.73 |  | 2.11 |  |  |
|  | 200° C. | 0.85 |  | 0.68 |  |  |
|  | 250° C. | 1.08 |  | 1.47 |  |  |
|  | 300° C. | 0.95 |  | 1.73 |  |  |

It is noted from Table 3 that the TFT samples exhibit good TFT characteristics even when the specific copper alloys (instead of pure copper or Cu—Ni alloy) are used for the source-drain electrodes.

What is claimed is:

1. A thin film transistor substrate comprising:
   a substrate;
   a semiconductor layer; and
   source-drain electrodes,
   wherein said source-drain electrodes comprise an oxygen-containing layer and a film of pure copper or a copper alloy,
   said oxygen-containing layer containing oxygen such that part or all of oxygen combines with silicon in said semiconductor layer to form a silicon oxide layer,
   said oxygen-containing layer formed by a plasma oxidation method or a thermal oxidation method, said film of pure copper or a copper alloy connecting with said semiconductor layer through said oxygen-containing layer, oxygen in said oxygen-containing layer combines with silicon such that the atomic ratio of oxygen to silicon ([O]/[Si]) has a maximum value ranging from 0.3 to 2.0, and said oxygen-containing layer has a thickness ranging from 0.17 nm to 3 nm.

2. The thin film transistor substrate as defined in claim 1, wherein said semiconductor layer is that of amorphous silicon or polycrystalline silicon.

3. A display device provided with the thin film transistor substrate as defined in claim 2.

4. The thin film transistor substrate as defined in claim 1, wherein said semiconductor layer is that of amorphous silicon or polycrystalline silicon.

5. A display device provided with the thin film transistor substrate as defined in claim 4.

6. The thin film transistor substrate as defined in claim 1, wherein said semiconductor layer is that of amorphous silicon or polycrystalline silicon.

7. A display device provided with the thin film transistor substrate as defined in claim 6.

8. The thin film transistor substrate as defined in claim 1, wherein the semiconductor layer comprises in part a doped silicon layer and said part or all of the oxygen combines with silicon in said doped silicon layer.

* * * * *